United States Patent [19]

Johnston

[11] Patent Number: 5,674,596

[45] Date of Patent: *Oct. 7, 1997

[54] COMPONENT OF PRINTED CIRCUIT BOARDS

[75] Inventor: James A. Johnston, Windham, N.H.

[73] Assignee: Johnson & Johnston Associates, Inc., Hampstead, N.H.

[*] Notice: The portion of the term of this patent subsequent to Oct. 1, 2009, has been disclaimed.

[21] Appl. No.: 955,121

[22] Filed: Oct. 1, 1992

Related U.S. Application Data

[63] Continuation of Ser. No. 750,798, Aug. 27, 1991, Pat. No. 5,153,050.

[51] Int. Cl.$^6$ ................................................. B32B 3/00
[52] U.S. Cl. .................... 428/209; 428/40.1; 428/192; 428/194; 428/198; 428/209; 428/901
[58] Field of Search ........................ 428/209, 901, 428/192, 194, 40, 198, 40.1

[56] References Cited

U.S. PATENT DOCUMENTS

| | | | |
|---|---|---|---|
| Re. 29,820 | 10/1978 | Koniček | 156/630 |
| 2,668,348 | 2/1954 | Hubbell | 29/195 |
| 2,706,165 | 4/1955 | Korsgaard | 154/126.5 |
| 2,864,755 | 12/1958 | Rothacker | 204/165 |
| 3,589,975 | 6/1971 | Andrews et al. | 161/165 |
| 3,647,592 | 3/1972 | Woodberry | 156/285 |
| 3,936,548 | 2/1976 | Koniček | 427/405 |
| 3,948,701 | 4/1976 | Fasbender et al. | 156/3 |
| 3,984,598 | 10/1976 | Sarazin et al. | 428/336 |
| 4,022,648 | 5/1977 | Woodberry et al. | 156/273 |
| 4,023,998 | 5/1977 | Cederberg et al. | 156/630 |
| 4,092,925 | 6/1978 | Fromson | 101/467 |
| 4,179,324 | 12/1979 | Kirkpatrick | 156/230 |
| 4,446,188 | 5/1984 | Patel et al. | 428/138 |
| 4,455,181 | 6/1984 | Lifshin et al. | 156/150 |
| 4,568,413 | 2/1986 | Toth et al. | 156/151 |
| 4,961,806 | 10/1990 | Gerrie et al. | 156/252 |
| 5,057,372 | 10/1991 | Imfeld et al. | 428/412 |
| 5,120,590 | 6/1992 | Savage et al. | 428/76 |

FOREIGN PATENT DOCUMENTS

| | | |
|---|---|---|
| 212 124 | 6/1986 | European Pat. Off. . |
| 235 582 | 1/1987 | European Pat. Off. . |
| 28 43 263 | 4/1978 | Germany . |
| 0 299 454 | 7/1987 | Germany . |
| 17601Y/10 | 3/1974 | Japan . |
| 91-018803/03 | 4/1989 | Japan . |
| 4-186798 | 3/1992 | Japan . |
| WO 88/03743 | 11/1987 | WIPO . |

OTHER PUBLICATIONS

PCT/US92/05874 23 Oct. 1992 Int'l Search Report.
IBM Technical Disclosure Bulletin, vol. 27, No. 8, Jan. 1985 by Pohl and Schmid.

*Primary Examiner*—William Krynski
*Attorney, Agent, or Firm*—Hamilton, Brook, Smith & Reynolds, P.C.

[57] ABSTRACT

A component for use in manufacturing articles such as printed circuit bards comprising a laminate of a sheet of copper foil and a sheet of aluminum or the like. A band of flexible adhesive joins the sheets around their borders and creates a protected central zone at the interface of the sheets. Islands of adhesive are located inwardly of the edges of the sheets through which tooling pin holes may be formed to facilitate handling of the foil.

14 Claims, 4 Drawing Sheets

PRIOR ART

COMPONENT OF PRINTED CIRCUIT BOARDS

This application is a continuation of application Ser. No. 07/750,798, filed on Aug. 27, 1991, now U.S. Pat. No. 5,153,050.

FIELD OF THE INVENTION

This invention relates to printed circuit boards in general and more specifically to components employed in the manufacturing of printed circuit boards and other articles.

BACKGROUND OF THE INVENTION

In its elementary form, a printed circuit board includes, as a component, a dielectric layer of an epoxy resin-impregnated woven glass fiber which is known as "prepreg". On the opposite sides of the prepreg are bonded conductive copper foil sheets. Subsequently the copper, through a number of photographic processes, is etched to produce conductive paths on the surface of the prepreg layer. When so assembled, the lamination is often called a core or a board.

In the manufacturing process, it is not uncommon to assemble a stack of such boards, either of the elementary type described above, or with compound layers. The assembly is called a press lay-up and the stack is called a book. The entire book is heated and subject to pressure. After cooling and curing, the then bonded individual boards are separated from each other and subjected to further processing. This general technique is described in my earlier U.S. Pat. No. 4,875,283.

Of tantamount importance in the manufacturing procedure is the maintenance of cleanliness or lack of contamination of the copper foil sheets. This is true, whether or not the printed circuit board is a simple sandwich of outer layers of copper foil and one layer of prepreg or whether its a compound board of numerous layers.

One of the chief causes of contamination is the presence of resin dust, fiberglass fibers, hair, bugs and various types of foreign material resulting from the earlier manufacture and cutting of the prepreg and shipping and storing of the prepreg. In the laying up of the book of printed circuit boards, great care is taken in removing the resin dust by various wiping techniques. Nevertheless, it is inevitable that some dust remains on the copper foil surfaces. The resin dust melts in the lamination process when heat and pressure is applied which results in dots or deposits on the surface of the copper.

Another cause of concern is the existence of pits or dents in the surface of the copper foil. This, too, can result from a spot of resin dust being on the foil during the heating and laminating process as it causes a depression in the copper. It can also result from handling of the very thin foil. To date, there is no sure method of eliminating the presence of resin dust, pits or dents although all efforts are made to alleviate the problem.

The presence of a pit or dent or unwanted deposit of molten resolidified resin on the surface of the copper sheet generally results in a defect in the finished product due to shorted or open conductive paths. In a finished printed circuit board are a series of parallel conductors. If there is a dent in the foil in the area where two conductors are to be formed in the imaging and the finishing process, the dent will become filled in and can cause an electrical short. Conversely, such a dent can also result in an open circuit if one of the conductors is discontinuous.

In today's technology, conductors are formed in the order of magnitude of 0.005 inches wide and generally with the same width spaces between two conductors. The desire and trend in the industry today is to make the conductors and the spaces between them even narrower as, for example, 0.00025 inches wide. If the surface of the copper is not perfect, either open or short circuits can be created, resulting in boards, which for the most part, are rejected. Sometimes boards are subject to reworking, but in higher technology usage, reworking is unacceptable and the boards become useless scrap.

Another cause of defects results from handling the foil. When the various layers of foil and prepreg are laid one upon another, their alignment is maintained by a series of tooling pins that extend upwardly from a tooling plate. The tooling plate is a thick steel plate constituting the bottom of the stack. Each layer, be it copper foil or prepreg or partially completed laminated cores of conductive material, are pre-drilled or pre-punched with holes in a predetermined pattern, generally adhering to industry standards of size and location. Each layer is then stacked manually over the tooling pins with the pins extending upwardly through the pre-drilled holes.

One side of the foil in the finished product becomes the exposed conductive path. The other side is generally treated in an oxiding process to produce a surface which has a roughness, is generally gray in color, and which permits better adherance to the molten resin in the bonding process. One weight of copper foil in use today is "half ounce foil" which means that ½ oz. of copper is distributed over 1 square foot. This results in a foil which is approximately 0.0007 inches in thickness. Foils of ¼ ounce and ⅛ ounce are also used. It is obvious that the handling of a foil this thin is a difficult problem. Layers of such foil must be placed manually over the tooling pins. This can result in wrinkles, and wrinkles, too, can result in imperfect conductive paths in the finished product.

One of the objectives of this invention is to provide means for better foil handling, not only to prevent folds or wrinkles, but to maintain cleanliness. Each time the operator assembles the layers required to complete one printed circuit board, he must place a separator on the top of the pile and then proceed to layup on top of it the components of another board. He must, in the process, wipe the surfaces of not only the separator but each of the conductive foils also.

Another source of defective boards is resin bleed that takes place around the tooling pins.

As stated above, each of the layers is placed upon tooling pins which, of necessity, must be somewhat smaller than the holes pre-cut into the copper foil and the prepreg layers. In the process of applying pressure and heat to the book, molten resin bleeds around the tooling pins and can fill up the tooling holes in the prepreg and foil layers. It also can bleed laterally between the various layers, particularly between the copper foil and the separator plates. After curing, this resin must be removed or it will create a resist material in the etching process. Furthermore, it can subsequently flake off onto the surface of the copper foil. Not only does the resin bleed have adverse effects on the surface of the copper, but it makes disassembly of the boards difficult when solidified resin has built up around the pins. Removal of the boards from the pins is thus made difficult.

In light of the foregoing, there are three principle objects of the present invention. One is to provide means to facilitate the handling of the extremely thin tissue-like copper foils.

Secondly, it is an object to assure that the copper foil is maintained as uncontaminated as possible before and during the manufacturing process.

Thirdly, it is another object of the present invention to prevent the resin bleed that takes place around the tooling pins from flowing between layers of the boards.

SUMMARY OF THE INVENTION

The invention is embodied in a component for use in the manufacturing of printed circuit boards and like articles. The component is a laminate constructed of at least one sheet of copper foil which, when fabricated into a printed circuit board, constitutes a functional element of the board, i.e., the conductive paths. The other element of the laminate is a substrate sheet of aluminum which constitutes a discardable element of a finished printed circuit board.

One surface of each of the copper sheet and the aluminum sheet is essentially uncontaminated and are engageable with each other at an interface.

A band of flexible adhesive joins the uncontaminated surfaces of the sheets together at their borders and defines a substantially uncontaminated central zone interiorally of the edges of the sheets and unjoined at the interface. The aluminum substrate provides stiffening for the copper foil and makes handling much easier.

The laminated component may be constructed of two sheets of copper foil which in a finished printed circuit board both constitute functional elements of separate boards and a single sheet of aluminum which constitutes a discardable element. The inner surface of each of the copper sheets and both surfaces of the aluminum sheets are essentially uncontaminated and engagable with each other at interfaces on opposite sides of the aluminum.

In like manner, the band of flexible adhesive joins each of the uncontaminated surfaces of the copper sheets to opposite uncontaminated surfaces of the aluminum sheet at their borders, hence, defining two substantially uncontaminated central zones interiorally of the edges of the sheets on opposite sides of the inner aluminum sheet.

There may be at least one island of flexible, water soluble adhesive joining the uncontaminated surfaces of the sheets at a predetermined location spaced inwardly from an edge of the joined sheets. A hole is cut or pre-drilled through the island and the sheets above and below it to provide tooling pin holes in the laminate. A plurality of such islands may be positioned inwardly of the marginal adhesive band which will constitute the areas in which the tooling holes will subsequently be punched. In the manufacturing process, the islands of adhesive prevent resin bleed from flowing between the superposed layers.

The above and other features of the invention, including various novel details of construction and combinations of parts, will now be more particularly described with reference to the accompanying drawings and pointed out in the claims. It will be understood that the particular component for use in the manufacture of printed circuit boards embodying the invention is shown by way of illustration only, and not as a limitation of the invention. The principles and features of this invention may be employed in varied and numerous embodiments without departing from the scope of the invention.

DETAILED DESCRIPTION OF THE INVENTION

Figure 1:
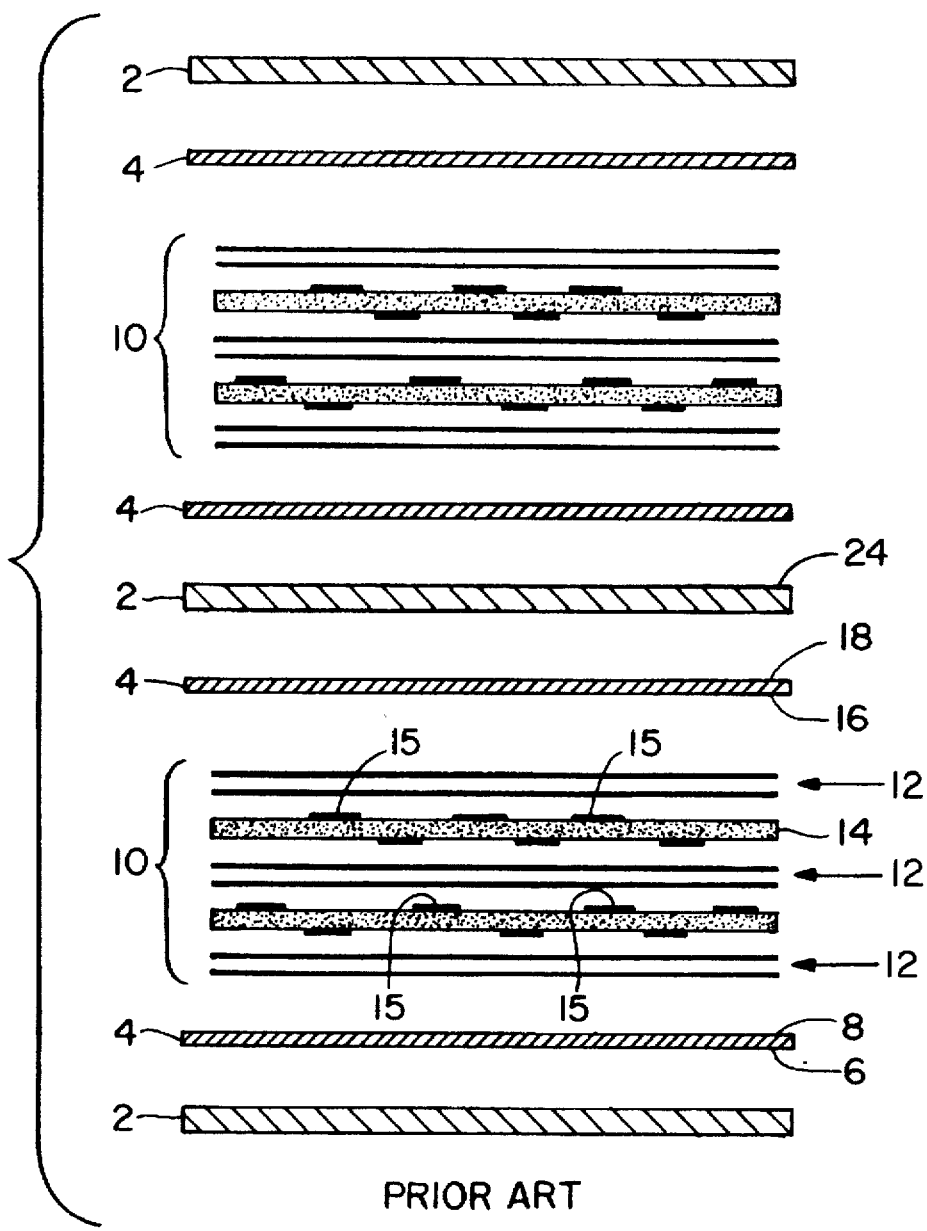
FIG. 1 is an expanded view of a schematic cross section of a conventional multilayer layup of two printed circuit boards prior to laminating.

FIG. 1 is a schematic view of a conventional 6 layer multilayer layup of two PC boards. From bottom to top, it includes first separator layer 2 which may be a conventional polished stainless plate covered with a sheet of release paper (not shown) as described in my earlier U.S. Pat. No. 4,875, 283, or a dual purpose separator-release sheet formed of aluminum and coated on both sides with a siloxazane polymer, also as taught in my U.S. Pat. No. 4,875,283. A first or "outside" copper foil layer 4 is placed upon the separator sheet 2 with its working or "clean" surface 6 facing downwardly. Its upper surface 8 may be oxidized to facilitate better bonding with the next surface which will be prepreg. Upon the copper is placed a laminated multilayer core, identified collectively as element 10, including three double plys 12 of prepreg and two double sided boards 14 pre-etched with conductive paths 15 on both surfaces. Upon this inner core laminate 10 is another sheet of copper foil 4 with an oxidized surface 16 laid upon the core 10 and with its upper or working surface 18 in engagement with another separator sheet 2.

The upper surface 18 of the copper foil 4 and surface 6 of lower foil 4 constitute the outer working surfaces of the first PC board in the stack. They will be etched to produce conductive paths when the board is finished.

Another book, identical to the first, is shown layed up on the upper surface 24 of the upper separator sheet 2, including copper foil layer 4, another core 10 and then a foil layer 2. These are typical six layer, multilayer, blanks since there are two separate layers of copper, one on each side (top and bottom) of the core 10 with the two double sided boards 14 having a total of 4 conductive path layers 15. Hence, this constitutes one six layer multilayer board.

Figure 3:
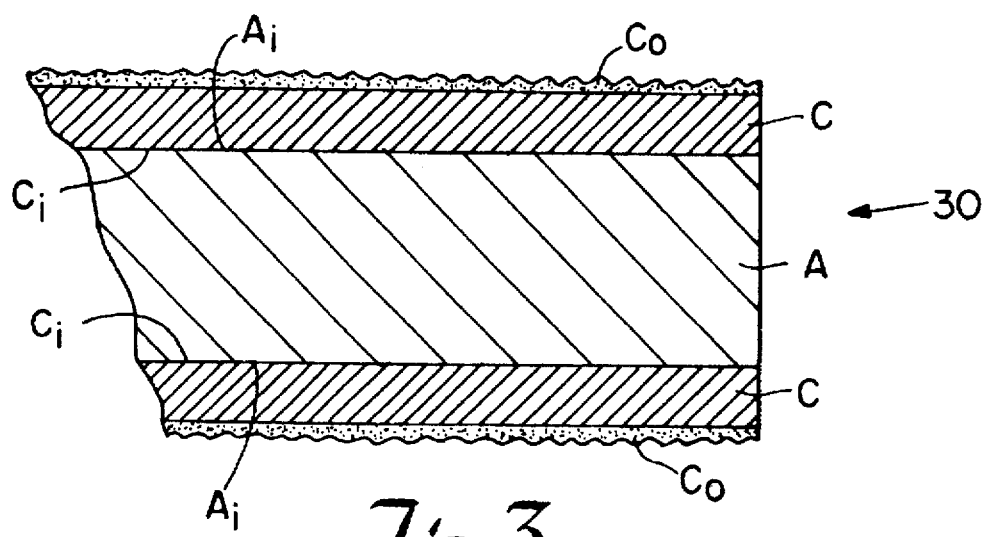
FIG. 3 is a schematic sectional view on enlarged scale of one embodiment of the component for use in the manufacturing of printed circuit boards embodying the features of the present invention.

A laminated component 30 is the subject matter of the present invention (also known as CAC, which is an acronym for copper-aluminum-copper) and will be seen in cross section in FIG. 3. It comprises a substrate A of commercial grade aluminum. Aluminum from about 0.010 to 0.015 inches in thickness has been found to be satisfactory, although the aluminum may be from about 0.001 inches to 0.125 inches thick depending upon the end use. Positioned on its upper surface is a sheet of copper foil C which, with this thickness aluminum, would be ½ oz. copper. This means that there is ½ ounce of copper by weight per square foot of the foil. When evenly distributed, its thickness will be approximately 0.0007 inches. Generally speaking, this is the industry standard at the present time for PC boards.

While aluminum is currently the preferred material for the substrate, other metals, such as stainless steel or nickel alloys, may be used. In some instances, such as in laminating plastic credit cards, polypropylene can be used.

The outer surface $C_o$ of the copper, shown in FIG. 3 as the upper surface, is preoxidized and often has a gray color depending on the oxidizing process employed, although other colors may result depending on the process. This is done to make it more readily adherable to the prepreg to which it will be bonded in the PC board making process. The inner surface of the copper $C_i$ is clean and uncontaminated and is often referred to as "virgin". This surface in a finished printed circuit board constitutes a functional element and will be etched to produce the desired circuit conductor configuration. The surface Ai of the aluminum sheet A which engages the surface $C_i$ is also essentially uncontaminated.

On the bottom surface of the aluminum sheet A is a second sheet of copper foil C, also having an outer oxidized surface $C_o$ and a "virgin" or uncontaminated inner surface $C_i$, the lower mating surface of the aluminum sheet A is also as clean and uncontaminated as it is possible to make.

Figure 4:
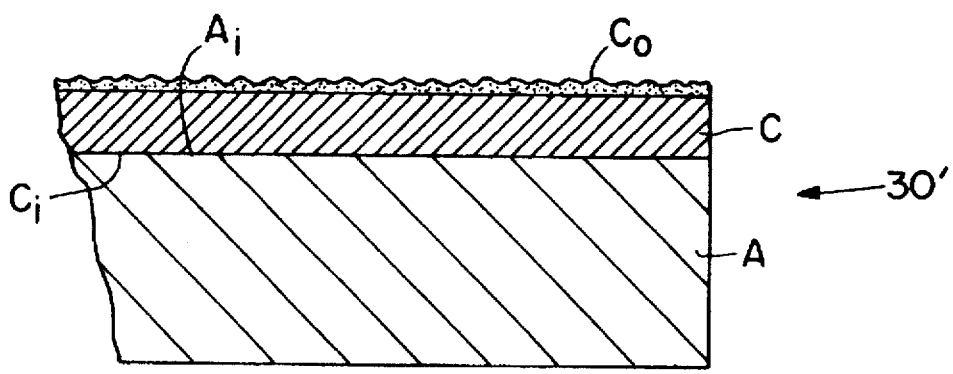
FIG. 4 is another embodiment thereof.

A laminated component 30' is an embodiment of the present invention (also known as CA, which is an acronym for copper-aluminum) and will be seen in cross section in FIG. 4.

As will be seen in FIG. 4, there is a single sheet of copper foil C on the substrate aluminum sheet A. This embodiment of the invention would be employed depending on the board manufacturers design of and requirements for a completed board. Aside from it having only a single layer of copper C, it is the same as the FIG. 3 embodiment. The copper layer C will constitutes a functional element of a finished printed circuit board and the aluminum A will constitute a discardable element.

Figure 5:
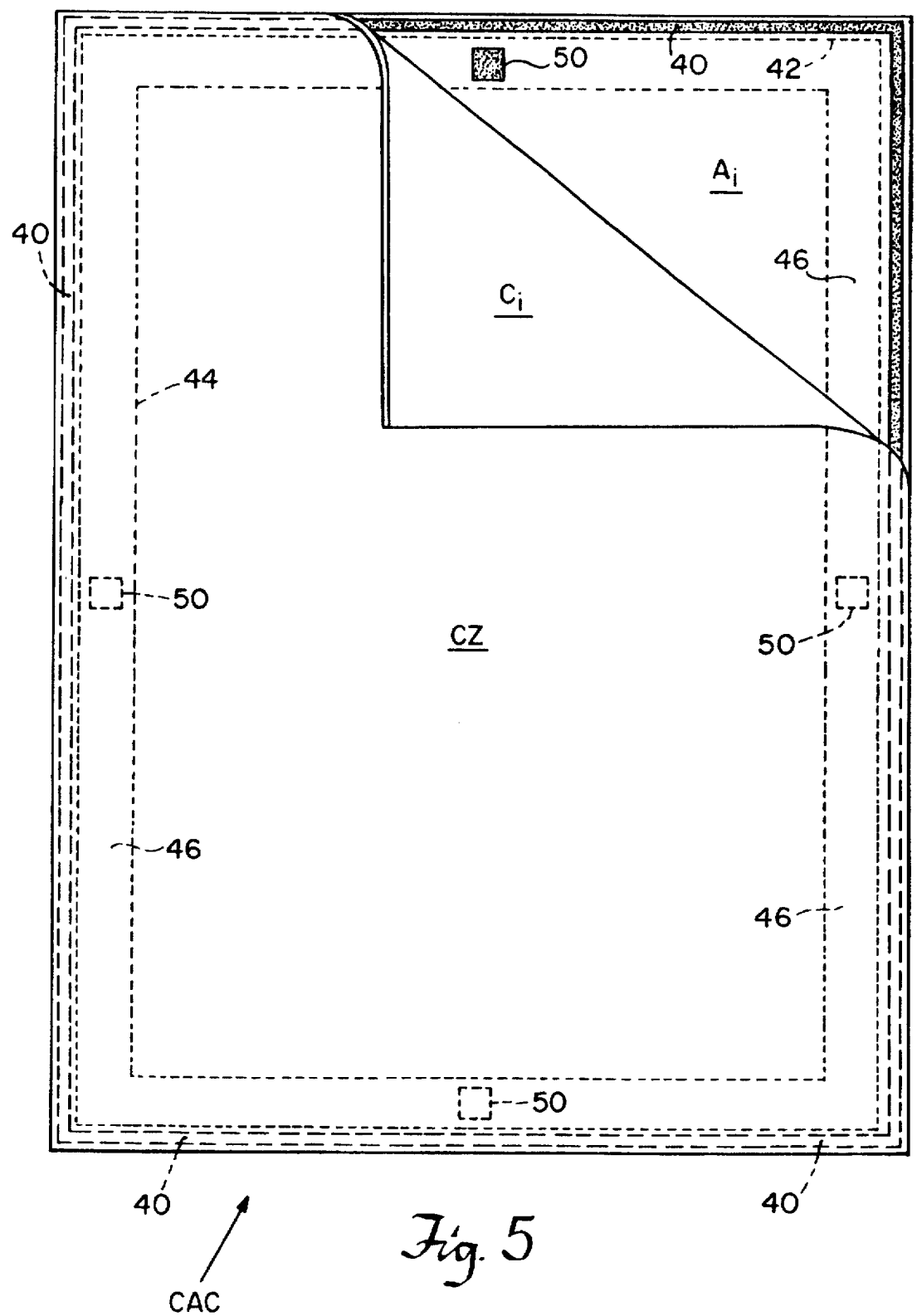
FIG. 5 is a schematic plan view of the component made in accordance with either of the embodiments.

Referring next to FIG. 5, the laminated component 30 or CAC is viewed with the oxidized surface $C_o$ of the copper foil layer facing upwardly and peeled back at one corner. One standard size sheet of copper foil employed in making PC boards today is 12×12 inches while another is 18×24 inches, although sheets as large as 48×72 are used. Sheets 36×48 may be cut into four separate sheets of 18×24. Other inbetween sizes are often used as well.

The CAC component shown in FIG. 5 includes a substrate layer of commercial grade aluminum A which is illustrated as from about 0.010 to about 0.015 inches in thickness. Overlaying the substrate is a sheet of copper foil which, in the illustrative example, would be ½ oz. copper, i.e., approximately 0.0007 inches in thickness. The peeled corner exposes inner or "virgin" surfaces of both the copper and the aluminum, $C_i$ and $A_i$, respectively.

A band of flexible adhesive 40 extends around the periphery of the component CAC near or at the border of the sheet and joins the uncontaminated surfaces, $C_i$ and $A_i$, of the copper and the aluminum together at their borders. Since the contacting surfaces are "virgin", or at least as clean as is physically possible to make them, the border 40 creates a substantially uncontaminated central zone CZ interiorally of the edges of the sheets.

The central zone is unjoined at the interface.

The band of flexible adhesive 40 is located in an adhesive application zone defined by the dotted line 42 and the edge of the component CAC. The zone may be from about 0.10 to 1.0 inches wide depending upon both the end product requirements and the size of the sheets of aluminum and copper being used. An adhesive band or strip from approximately 0.060 to approximately 0.090 inches in width has been found satisfactory although it may be from about 0.010 inches to 0.500 depending upon the size of the sheets being laminated and from approximately 0.001 to approximately 0.005 inches thick, a thickness of 0.001 to 0.002 has been found satisfactory.

The central zone CZ is defined by a border line 44 spaced inwardly from the adhesive application zone line 42. Whereas the finished circuit board will comprise the area CZ, a band 46 lies outwardly of the central zone border line 44 and inwardly of the adhesive application zone line 42. This band is frequently employed for making test portions of small bards for quality control purposes.

After the stack of PC bards (often as many as 10) have been assembled and joined by heating under pressure after they are cured, the boards will be trimmed down in size to the inner limit of the adhesive application zone herein designated by the reference character 42.

Thus, the band 40 of flexible adhesive 40 seals the layers of copper and aluminum before and during the manufacturing process against the intrusion of prepreg dust or any other contaminant which could result from particles in the air, fingerprints, grease spots, or the like.

Whereas the configuration of the CAC component has been described with reference to a single sheet of copper C lying upon the aluminum substrate A, the invention is equally applicable to the embodiments shown in both FIGS. 3 and 4. That is, copper foil may be secured to both opposite sides of the aluminum substrate A. In the finished product both the copper foils will constitute functional elements of separate PC boards and the single aluminum substrate constitute a discardable element.

In the FIG. 3 configuration, one surface each of the copper foils C and both surfaces of the aluminum substrate A are essentially "virgin" and uncontaminated. There is a band of flexible adhesive 40 joining each of the uncontaminated surfaces $C_i$ of the copper sheets C to opposite uncontaminated surfaces Ai of the aluminum substrate A at their borders and thus define two substantially uncontaminated central zones interiorally of the edges of the sheets on opposite sides of the aluminum substrate A.

Whereas the invention has been described with reference to making printed circuit boards, it may also be employed by laminators who make base laminates as an earlier step in the final product.

Furthermore,, the principles of the invention can be employed in the manufacture of credit cards which require extreme cleanliness. In this instance, the substrate could be aluminum and this "foil" equivalent would be plastic. Other substrates could be cured as well.

As will be seen FIG. 5, there are four islands 50 of flexible, water soluble adhesive joining one uncontaminated surface of the sheets at predetermined locations. The islands are spaced inwardly from the edge of the joined sheets. The islands 50 are located inwardly of the adhesive application zone defined by the line 42. Thus, it is located inwardly of the adhesive band 40 and outboard of the border 44 dividing the central zone CZ from the test portion band. In the illustrative embodiment, the islands 50 are located close to opposite edges of the sheet and spaced equidistant top to bottom and side to side. These islands or dots, as they are also called, are shown as square in configuration, but they may assume any other convenient configuration. Their exact location relative the sheets is governed by the pattern of the tooling pins.

The islands 50 are approximately 0.4 inches square for average size tooling pins. They may be as small as 0.1 inches square to about 1.0 inches square depending on the size of the boards and the diameter of the pins. The adhesive is from about 0.0005 to 0.005 inches thick. A thickness of 0.001 to 0.002 inches has been found satisfactory.

The islands may be located off center in order to coincide with the tooling pins configuration in the particular press structure for which the composite sheets are being made.

The composite CAC sheets are punched or drilled through the islands to accomodate the tooling pins of a press setup.

Figure 6:
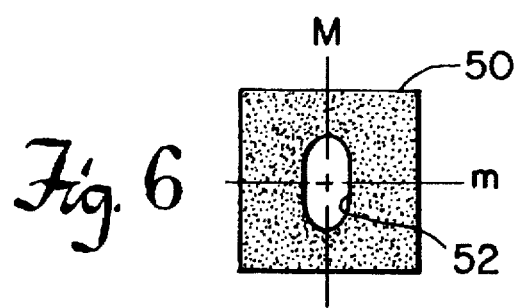
FIG. 6 is an enlarged view of an island of adhesive with a tooling pin hole formed in it.

As seen in FIG. 6, the CAC sheets will be punched, drilled or machined. The hole 52 is oblong and accomodates the tooling pins. The shape of the holes are dictated by the shape of the tooling pins. The minor axis dimension m of each oblong hole will be slightly larger than the diameter of a tooling pin, while the major M axis will accomodate any misaligned registration of the pins in the major axis direction. The major axes are arranged at right angles with the edges of the sheets and the minor axes will be parallel to the edges of the sheets in the respective islands 50 nearest an edge.

Figure 2:
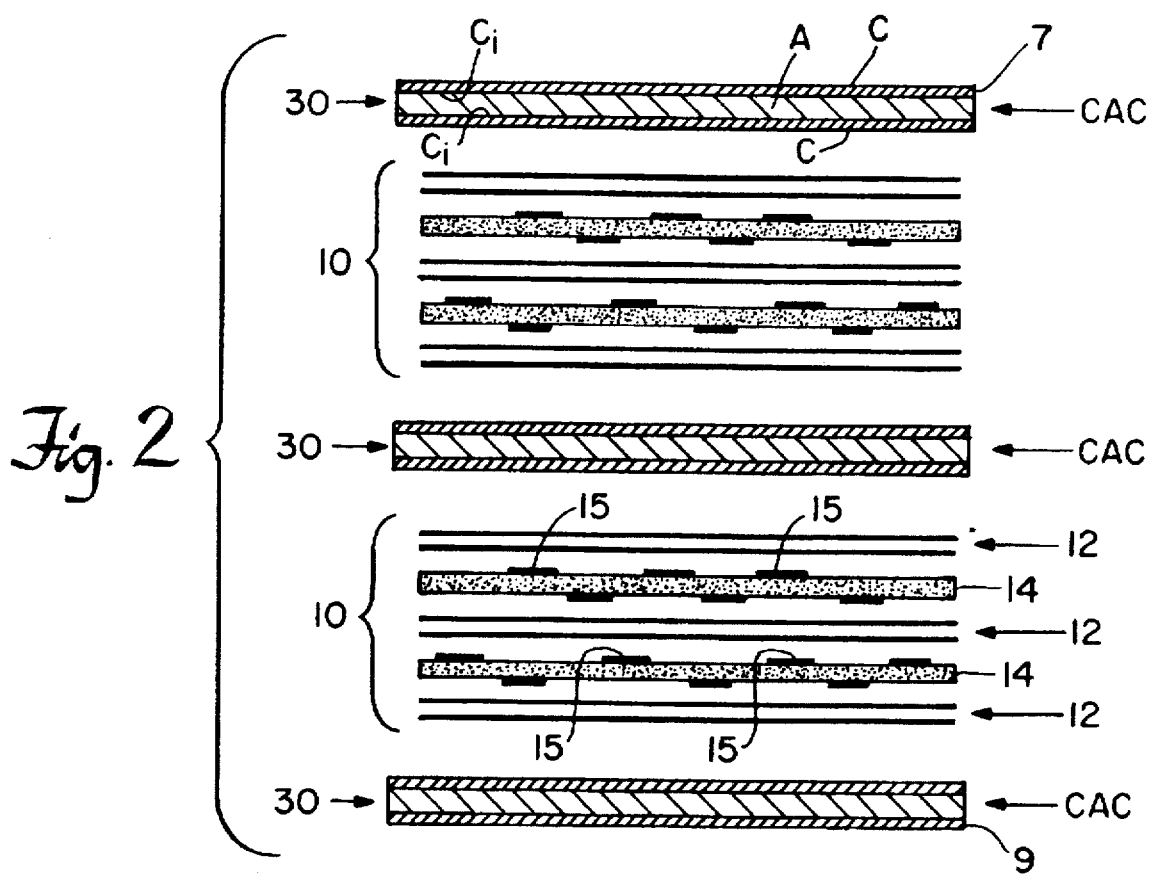
FIG. 2 is an expanded view of a schematic cross section of two printed circuit boards being made in accordance with the features of the present invention prior to bonding.

FIG. 2 shows the layup of two PC boards being assembled by use of my new laminated component 30 which is the subject of this invention. Two cores 10, identical with those described previously with regard to FIG. 1, are sandwiched between three sheets of my new laminated CAC component 30. There is no stainless steel sheets with release paper or coated aluminum as described in my earlier patent and with reference to FIG. 1. The resulting finished PC beards will be identical to those of FIG. 1.

The foil layers 7 and 9 shown in FIG. 2 will constitute the lower and upper layers, respectively, of two additional PC boards in the book immediately above and below those shown in 2. The remainder of the boards have been eliminated for clarity. There are frequently as many as ten total six-layer PC boards in a stack or book which are assembled and cured simultaneously.

When the sheets are laid up to form a book of perhaps as many as ten PC boards, the pressure applied to the book causes the molten prepreg to flow around the tooling pins and lengthwise of their axis. This flow takes place through the then apertured stack of boards and the inclination is to flow inwardly along the copper surfaces. This could cause not only contamination, but also separation of the sheets and is a major source of rejections.

The purpose of the adhesive islands is to seal the clean interface between the copper $C_i$ and the aluminum $A_i$ from the bleeding of melted prepreg during the heating and bonding process. Since the tooling holes are punched in the area of the islands 50, the presence of the adhesive prevents the flow of prepreg laterally into the interface of the copper C and aluminum A, thus eliminating the problem.

After a book of PC boards have been laminated, cured and cooled, the boards are ready to be separated. The FIG. 2 configuration will be separated into 2 complete PC boards with the three aluminum layers A of the CAC components discarded. The uppermost copper foil designated 7 will be the lower outside surface of a board (not shown) and the lowermost copper foil 9 will be the upper outside layer of another board (not shown). Separation takes place between the "virgin" or uncontaminated surface $C_i$ of the copper and the uncontaminated surface $A_i$ of the aluminum substrate as seen in FIGS. 3 and 4.

With reference to FIG. 2, separation will take place along the "clean surface" $C_i$ of the uppermost laminated CAC component 30. In each instance, the aluminum A will be separated from the copper C in each of the three CAC components shown in FIG. 2 with the copper C bonded to the particular core 10 by prepreg and the aluminum discarded, recycled or used for other purposes.

Because the frail, thin copper foil C was adhesively secured to its aluminum substrate A, the CAC component 30 is stiffer and more readily handled resulting in far fewer spoils due to damaged copper foil.

The use of the adhered substrate A, regardless of what material it is made of, makes the consumer's (manufacturer's) objective of using thinner and thinner foils and ultimately automating the procedure more realistic since the foil, by use of the invention, is no longer without the much needed physical support.

Because of the presence of the band of adhesive 40 that originally secured the copper and aluminum layers together, no prepreg dust or other contaminant has been able to reach the zone CZ before and during the manufacturing process.

Because the tooling pins were formed in the adhesive islands 50, no prepreg has been able to ooze into the interfaces between the aluminum and copper layers. Subsequently, the water soluble adhesive used to form the islands 50 is washed away in standard cleaning process of the bonded boards, the boards trimmed to size, the aluminum substrate does not become part of the finished board, but may be discarded or recycled.

The three objectives of this invention are met by use of the CAC component.

What is claimed is:

1. A component for use in manufacturing articles such as printed circuit boards, the component comprising:

a laminate constructed of a sheet of copper foil which, in a finished printed circuit board, constitutes a functional element and a substrate sheet of aluminum which constitutes a discardable element;

one surface of each of the copper sheet and the substrate aluminum sheet being essentially uncontaminated and engagable with each other at an interface; and flexible adhesive joining the uncontaminated surfaces of the sheets together at their borders and defining a substantially uncontaminated central zone inwardly of the edges of the sheets and unjoined at the interface.

2. A component for use in manufacturing articles such as printed circuit boards, the component comprising:

a laminate constructed of two sheets of copper foil which, in a finished printed circuit board, constitute functional elements and a substrate sheet of aluminum which constitutes a discardable element;

one surface of each of the copper sheets and both surfaces of the substrate aluminum sheet being essentially uncontaminated and engagable with each other at interfaces; and flexible adhesive joining the uncontaminated surfaces of the sheets together at their borders and defining substantially uncontaminated central zones inwardly of the edges of the sheets and unjoined at the interface.

3. A component for use in manufacturing articles such as printed circuit boards, the component comprising:

a laminate constructed of a sheet of copper foil which, in a finished printed circuit board, constitutes a functional element and a metal substrate sheet which constitutes a discardable element;

the substrate having greater thickness than the foil sheet;

one surface of each of the foil sheet and the substrate being essentially uncontaminated and engagable with each other at an interface; and flexible adhesive joining the uncontaminated surfaces of the sheets together at their borders and defining substantially uncontaminated central zones inwardly of the edges of the sheets and unjoined at the interface such that the substrate facilitates the handling of the foil.

4. A component for use in manufacturing articles according to claim 3 wherein the thickness of the foil sheet is from approximately 0.000175 to approximately 0.0007 inches.

5. A component for use in manufacturing articles according to claim 3 wherein the thickness of the substrate is from approximately 0.001 inches to approximately 0.125 inches.

6. A component for use in manufacturing articles such as printed circuit boards, the component comprising:

a laminate constructed of a two sheets of copper foil which, in a finished printed circuit board, constitutes functional elements and a metal substrate sheet which constitutes a discardable element;

the substrate having greater thickness than the foil sheets;

one surface of each of the foil sheets and both surfaces of the substrate being essentially uncontaminated and engagable with each other at interfaces; and flexible adhesive joining the uncontaminated surfaces of the sheets together at their borders and defining substantially uncontaminated central zones inwardly of the edges of the sheets and unjoined at the interfaces such that the substrate facilitates the handling of the foil.

7. A component for use in manufacturing articles according to claim 6 wherein the thickness of the foil sheets is from approximately 0.000175 to approximately 0.0007 inches.

8. A component for use in manufacturing articles according to claim 6 wherein the thickness of the substrate is from approximately 0.001 inches to approximately 0.125 inches.

9. A component for use in manufacturing articles such as printed circuit boards comprising:

a laminate constructed of a sheet of copper foil which, in a finished printed circuit board, constitutes a functional element and a sheet of stainless steel which constitutes a discardable element;

one surface of each of the copper sheet and the stainless steel sheet being essentially uncontaminated and engagable with each other at an interface; and flexible adhesive joining the surfaces of the sheets together at their borders and defining a substantially uncontaminated central zone inwardly of the edges of the sheets and unjoined at the interface.

10. A component for use in manufacturing articles such as printed circuit boards comprising:

a laminate constructed of two sheets of copper foil which, in a finished printed circuit board, constitutes functional elements and a sheet of stainless steel which constitutes a discardable element;

one surface of each of the copper sheet and the stainless steel sheet being essentially uncontaminated and engagable with each other at interfaces; and flexible adhesive joining the surfaces of the sheets together at their borders and defining substantially uncontaminated central zones inwardly of the edges of the sheets and unjoined at the interfaces.

11. A component for use in manufacturing articles such as printed circuit boards comprising:

a laminate constructed of a sheet of copper foil which, in a finished printed circuit board, constitutes a functional element and a sheet of steel which constitutes a discardable element, one surface of each of the copper sheet and the stainless steel sheet being essentially uncontaminated and engagable with each other at an interface; and flexible adhesive joining the uncontaminated surfaces of the sheets together at their borders and defining a substantially uncontaminated central zone inwardly of the edges of the sheets and unjoined at the interface.

12. A component for use in manufacturing articles such as printed circuit boards comprising:

a laminate constructed of two sheets of copper foil which, in a finished printed circuit board, constitutes functional elements and a sheet of steel which constitutes a discardable element;

one surface of each of the copper sheet and the steel sheet being essentially uncontaminated and engagable with each other at interfaces; and flexible adhesive joining the uncontaminated surfaces of the sheets together at their borders and defining substantially uncontaminated central zones inwardly of the edges of the sheets and unjoined at the interfaces.

13. A component for use in manufacturing articles such as printed circuit boards comprising:

a laminate constructed of a sheet of copper foil which, in a finished printed circuit board, constitutes a functional element and a sheet of metal substrate which constitutes a discardable element;

one surface of each of the copper sheet and the metal substrate sheet being essentially uncontaminated and engagable with each other at an interface; and flexible adhesive joining the uncontaminated surfaces of the sheets together at their borders and defining a substantially uncontaminated central zone inwardly of the edges of the sheets and unjoined at the interface.

14. A component for use in manufacturing articles such as printed circuit boards comprising:

a laminate constructed of two sheets of copper foil which, in a finished printed circuit board, constitutes functional element and a sheet of metal substrate which constitutes a discardable element;

one surface of each of the copper sheet and the metal substrate sheet being essentially uncontaminated and engagable with each other at interfaces; and flexible adhesive joining the uncontaminated surfaces of the sheets together at their borders and defining substantially uncontaminated central zones inwardly of the edges of the sheets and unjoined at the interfaces.

* * * * *